United States Patent [19]

Weiser et al.

[11] Patent Number: 4,891,582
[45] Date of Patent: Jan. 2, 1990

[54] OPTICAL APPARATUS AND METHOD FOR PHOTOCARRIER DIFFUSION LENGTH MEASUREMENT

[75] Inventors: Kurt Weiser, Haifa; Elia Zeldov, Herzlia; Dan Ritter, Haifa, all of Israel

[73] Assignee: Technion Research & Development Foundation, Haifa, Israel

[21] Appl. No.: 348,127

[22] Filed: May 3, 1989

Related U.S. Application Data

[63] Continuation of Ser. No. 100,324, Sep. 23, 1987, abandoned.

[30] Foreign Application Priority Data

Sep. 24, 1986 [IL] Israel .......................................... 80143

[51] Int. Cl.[4] .............................................. G01R 29/02
[52] U.S. Cl. ............................... 324/158 R; 324/158 D
[58] Field of Search ........... 324/158 D, 158 R, 158 T, 324/96; 250/492.2; 437/8

[56] References Cited

U.S. PATENT DOCUMENTS

| 4,232,264 | 11/1980 | Papp et al. | 324/96 |
| 4,454,472 | 6/1984 | Moore | 324/158 D |
| 4,456,879 | 6/1984 | Kleinknecht | 324/158 R |
| 4,642,567 | 2/1987 | Jastrzebski et al. | 324/158 D |

FOREIGN PATENT DOCUMENTS 547871 10/1957 Canada .......................... 324/158 D

OTHER PUBLICATIONS

A. R. Moore-Semiconductors and Semimetals, edited by J. I. Pankove, Academic Press 1984, vol. 21C, Chap. 7.
Eichler in Festkorperprobleme, Advances in Solid State Physics, vol. XVIII, pp. 241, (1978).
R. A. Smith-Semiconductors, Cambridge University Press, (1961).

Primary Examiner—Reinhard J. Eisenzopf
Assistant Examiner—Edward Urban
Attorney, Agent, or Firm—Finnegan, Henderson, Farabow, Garrett & Dunner

[57] ABSTRACT

An optical apparatus and method for measuring the diffusion length in an insulating photoconductor or a semiconductor sample material, that includes a source of coherent light; means for splitting the light source and providing transmitted and reflected beams each having a variable light intensity, one of the transmitted and reflected beams being incident as a background beam at a location on the sample material, means for directing the other of the transmitted and reflected beams so as to be incident at the location as a probe beam, the directing apparatus establishing a predetermined angle between the background and probe beams at the location, polarizing means disposed in the path of the background beam and having one of two predetermined orientations corresponding to polarized and nonpolarized states of the beam passing therethrough, means disposed in the path of the probe beam for periodically blocking the passage thereof; and means for measuring changes in the periodic photocurrent supplied by a power source through the sample material in response to the operation of the periodic blocking apparatus for each of the polarized and non-polarized states to thereby determine the diffusion length of the sample material.

17 Claims, 2 Drawing Sheets

OPTICAL APPARATUS AND METHOD FOR PHOTOCARRIER DIFFUSION LENGTH MEASUREMENT

This application is a continuation of application Ser. No. 100,324, filed Sept. 23, 1987, now abandoned.

FIELD OF THE INVENTION

The present invention relates to an optical apparatus for measuring the ambipolar diffusion length of photocarriers in insulating photoconductors and semiconductors.

BACKGROUND OF THE INVENTION

It is known that the performance of devices incorporating semiconductor and insulating photoconductor materials is dependent upon the properties of both the majority and minority charge carriers. While measurement of the properties of the majority carriers is relatively easy, the characteristics of devices using these materials is more often dependent upon the minority carriers. Therefore, measurement of the properties of the minority carriers is important in choosing these materials for manufacture of commercial products such as solar cells, bipolar transistors, photocopiers, etc.

The best known method of determining the properties of minority carriers is to measure the diffusion length of the carriers. This is because both majority and minority carriers must diffuse together in the material to maintain space charge neutrality. Therefore, the minority carrier, which is the slower moving of the two carrier types determines the diffusion rate. A key property of the minority carrier can be obtained by measuring its diffusion length, which is the product of its mobility and lifetime.

In photovoltaic devices such as solar cells, the minority carrier diffusion length is the single most important parameter in determining the performance of the solar cell. A high diffusion length insures a high efficiency in solar cell performance and good quality in the performance of bipolar transistor devices.

Known methods for measuring the diffusion length of the minority carriers in a sample material include the surface photovoltage method (SPV) as described by A. R. Moore in the text Semiconductors and Semimetals, edited by J. I. Pankove, Academic Press, 1984, Vol. 21C, Chap. 7. This method uses optical apparatus capable of emitting light at different wavelengths such as a broad band light source together with a monochromator. In addition, another light source is needed to provide a strong background illumination for the sample material. The material is connected between two contacts, each of which has strict requirements, one of these being a rectifying contact which is transparent to the illumination and the other being ohmic. A voltage produced by the illumination is measured between these contacts and the intensity of the variable wavelength light source is varied so as to keep that voltage constant. The diffusion length is obtained from a plot of the data relating the light intensity and wavelength for constant voltage.

In addition to the complexity of the optical apparatus and the special contacts required for the voltage measurement, the intense background illumination required in this method causes the sample material to degrade during the measuring process which affects the accuracy of the measurement.

Another known method for diffusion length measurement is the transient grating spectroscopy method as discussed by Eichler in Festkorperproblems, Advances in Solid State Physics, Vol. XVIII, p. 241 (1978). In this technique, pulses of two coherent light beams which illuminate the sample material momentarily form an interference pattern which creates a varying concentration of majority and minority carriers and so changes the refractive index of the material. A third probe beam is directed on the sample and is diffracted by this optical grating. The diffracted light is measured as a function of time, and because of the time dependency of the diffracted light and the difficulty in locating the precise spot where the diffraction takes place, neither the method itself nor the analysis of the results is trivial. Furthermore, the results relate to a transient rather than a steady state condition of the sample material, the latter being conditions which are normally encountered in the use of solar cells and similar devices.

It would therefore be desirable to provide an optical apparatus incorporating a simple method of measuring the diffusion length as a key property of insulating photoconductor and semiconductor materials.

SUMMARY OF THE INVENTION

It is accordingly a principal object of the invention to overcome the above-mentioned disadvantages in existing measurement techniques and provide an optical apparatus for measuring the diffusion length of insulating photoconductor and semiconductor materials.

According to the invention, there is provided an optical apparatus for measuring the diffusion length in an insulating photoconductor or a semiconductor sample material, the apparatus comprising:

a source of coherent light;

apparatus for splitting the light source and providing transmitted and reflected beams each having a variable light intensity, one of the transmitted and reflected beams being incident as a background beam at a location on the sample material;

apparatus for directing the other of the transmitted and reflected beams so as to be incident at the location as a probe beam, the directing apparatus establishing a predetermined angle between the background and probe beams at the location;

polarizing apparatus disposed in the path of the background beam and having one of two predetermined orientations corresponding to polarized and non-polarized states of the beam passing therethrough;

apparatus disposed in the path of the probe beam for periodically blocking the passage thereof;

apparatus for measuring changes in the periodic photocurrent supplied by a power source through the sample material in response to the operation of the periodic blocking apparatus for each of the polarized and non-polarized states; and apparatus for receiving the measured periodic photocurrent changes and providing in accordance therewith the diffusion length of the sample material.

The principle of the diffusion length measurement is that the changes in the periodic photocurrent are different depending on whether the beams which illuminate the sample material do or do not interfere. In the interference case, the split beams are coherent and an optical grating is produced at the location of coincidence on the sample material by the interference of the split beams. In the non-interference case, the split beams are incoherent and simply combine linearly to increase the level of illumination. From the difference in the photocurrent between the two cases, the diffusion length of the minority carrier can be calculated.

In a preferred embodiment, the novel optical apparatus includes a laser for providing the coherent source of light which is split by a variable beamsplitter into two beams, a background beam and a probe beam having reduced intensity with respect to the background beam. A mirror arrangement directs the beams onto the sample material at a location so that they are coincident with a predetermined angle between them. The polarizing apparatus is provided by a half wave plate in the path of the background beam. The half wave plate has its orientation adjusted so that the background beam and the probe beam are either made to interfere or not, in the former case producing an optical grating on the sample material in accordance with the predetermined angle.

The apparatus for periodically blocking the probe beam is provided by passing this beam through a beam chopper, and the apparatus for sensing the difference in the periodic photocurrent in each of the two cases is provided by the combination of a lock-in amplifier, resistor and power supply. The power supply and resistor are connected in series arrangement with the sample material which is connected via a pair of low resistance contacts. The lock-in amplifier is synchronized with the beam chopper and connected so as to measure the voltage developed across the resistor for each of the two orientations of the half wave plate when the probe beam periodically illuminates the sample.

The apparatus for providing the diffusion length supplies a calculation based on the measurements taken from the interference and non-interference cases. The calculation of the diffusion length is performed in accordance with a mathematical relationship based on a novel derivation from a known equation describing the behavior of carriers during diffusion.

In an alternative embodiment, the variable beamsplitter is provided by a combination of a beamsplitter and a neutral density filter acting as an attenuator of the probe beam.

The apparatus is a simple one and the measurement method is such that the diffusion length of the minority carriers in the sample material is provided by a straightforward measurement technique. Thus, the apparatus can quickly determine the suitability of the sample material for use in a commercial product such as a solar cell or bipolar transistor device. In addition, the technique is substantially free of thermal grating effects present in other techniques.

Other feature and advantages of the invention will become apparent from the drawings and the description which follows.

BRIEF DESCRIPTION OF THE DRAWINGS

For a better understanding of the invention with regard to the embodiments thereof, reference is made to the accompanying drawings, in which.

DETAILED DESCRIPTION OF A PREFERRED EMBODIMENT

Figure 1:
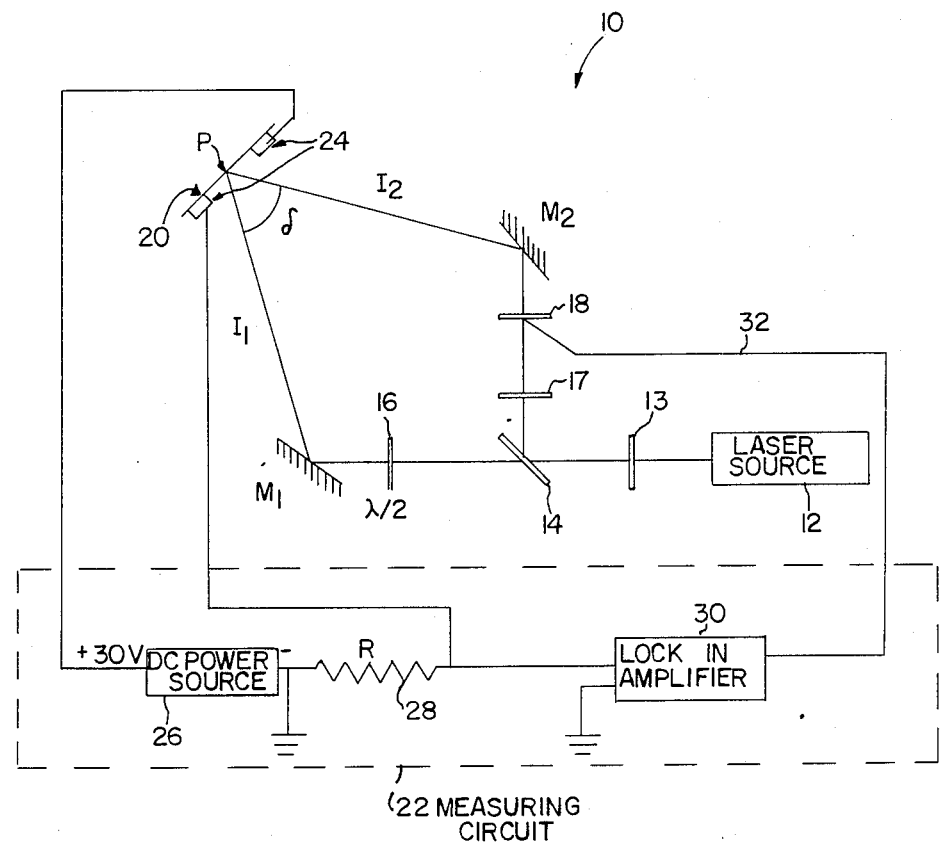
FIG. 1 is a schematic representation of an optical apparatus for measuring changes in the photocurrent in a sample material in accordance with the principles of the present invention.

Referring now to FIG. 1, there is shown a schematic representation of a preferred embodiment of the optical apparatus 10 of the present invention. Apparatus 10 includes a laser source 12, a variable neutral density filter 13, a beamsplitter 14, a half wave plate 16, a neutral density filter 17, a beam chopper 18, a pair of mirrors M1 and M2, and a sample material 20 to be investigated regarding its minority carrier diffusion length. The sample material 20 is an insulating photoconductor or semiconductor material in which a photocurrent is produced in response to illumination by light. As described further herein, the diffusion length can be extracted from data about the response in the magnitude of the photocurrent under predetermined conditions of light illumination.

Also shown in FIG. 1 is an electrical circuit 22 in which sample material 20 is connected by means of a pair of contacts 24 in series arrangement with a DC power source 26, typically 30 volts, and a resistor 28, typically 100K ohms. Contacts 24 are formed on sample material 20 through a known technique such as vapor deposition as used in microelectronic technology, and by the nature of this technique they are made to have a lower contact resistance than the overall resistance of sample material 20. Connected in parallel arrangement across resistor 28 is a lock-in amplifier 30 which is a commonly used laboratory instrument, e.g. Princeton Applied Research Corp. Model H-8, connected to receive a reference signal 32 from beam chopper 18.

Laser source 12 may be any type of linearly polarized laser type, and is chosen to have an appropriate wavelength for absorption by sample material 20. For example, if sample material 20 is amorphous hydrogenated silicon (a-Si:H), the typical laser source 12 is a 5 mW HeNe laser (632.8 nm wavelength).

In operation, the laser light produced by laser source 12 is adjusted regarding its intensity as desired by variable neutral density filter 13 and then directed through beamsplitter 14 which forms two split beams I1 and I2. Beams I1 and I2 are directed to reflect off respective mirrors M1 and M2 which are arranged so that the split beams are incident upon sample material 20 at a location P thereon with angle c between them. Beam I2, known as the probe beam, has its intensity attenuated by a neutral density filter 17 placed in its path after beamsplitter 14. Therefore, relative to the intensity of beam I1, which is known as the background beam and maintains constant bias excitation intensity, the intensity of beam I2 is reduced. The reduction in the intensity of beam I2 can be obtained in an alternative embodiment by use of a variable beamsplitter in place of beamsplitter 14.

There is located in the path of beam I1 a half wave plate 16. Depending on the orientation of half wave plate 16, beams I1 and I2 ca be made to have parallel polarization so that they interfere, or the polarization of beam I1 can be rotated by 90 degrees with respect to the polarization of beam I2 so that they do not interfere. Thus, the orientation of half wave plate 16 enables optical apparatus 10 to be operated under two distinct cases, the interference case being the one in which the two beams I1 and I2 are coherent and interfere at location P where they are coincident, and the non-interference case being that case in which they are not coherent and do not interfere at location P.

In the interference case, when the two beams I1 and I2 are made to interfere by virtue of the half wave plate 16 orientation, they create an optical grating on sample material 20 at location P. As is known from holographic techniques, the optical grating is a sinusoidally varying light intensity pattern proportional to the intensity of each of beams I1 and I2 and having a grating period $\Lambda$ given by:

$$\Lambda = \lambda/(2 \sin(\delta/2)) \quad (1)$$

where $\lambda$ is the light wavelength and $\delta$ the angle between the two beams I1 and I2. In accordance with the measurement technique of the present invention, the photocurrent in sample material 20 is related to the optical grating period by what is termed herein the photocarrier grating effect. The effect is substantially free of any thermal grating effects.

The measurement technique in accordance with the invention proceeds by establishing angle $\delta$ to obtain a desired optical grating period and then measuring the change in the photocurrent produced in sample material 20 by the probe beam I2 in the interference case just described. This is accomplished by operating beam chopper 18 to periodically allow probe beam I2 to illuminate sample material 20 in the presence of illumination by background beam I1. The periodicity of beam chopper 18 operation allowing this illumination determines reference signal 32 with frequency information allowing lock-in amplifier 30 to synchronize with this periodic illumination.

As is the nature of sample material 20, the high resistivity which it exhibits in the dark will be decreased upon illumination by the beams I1 and I2 such that a change in the photocurrent can be measured in electric circuit 22 by the development of a voltage across resistor 28. This voltage is sensed by lock-in amplifier 30 as an AC voltage component because the intentional periodic illumination of sample material 20 by operation of beam chopper 18 causes probe beam I2 to create small changes in the photocurrent. Lock-in amplifier 30 acts as a tuned amplifier which measures the variations in voltage across resistor 28 in a narrow range of frequencies defined by reference signal 32. Thus, the in-phase component of the change in the photocurrent can be isolated from that produced by noise or the background illumination.

After this measurement is performed for the interference case, the orientation of half wave plate 16 is rotated for the non-interference case and the measurement is repeated. Here, probe beam I2 and background beam I1 do not interfere and add linearly to the level of illumination on sample material 20. Again, the operation of beam chopper 18 is synchronized with lock-in amplifier 30 for isolation of the change in the photocurrent produced by the probe beam I2 in this case.

The above procedure is carried out for different values of angles $\delta$ between the background and probe beams I1 and I2. As established earlier in equation (1), this has the effect of changing the grating period $\Lambda$ created in the interference case. The bias excitation intensity provide by background beam I1 is maintained constant, and this is accomplished by monitoring the quiescent DC photocurrent level and adjusting neutral density filter 17 to maintain the preset value. In experiments which were conducted using optical apparatus 10, the bias excitation I1 intensity was 200 mW/cm² based on adjustment of variable neutral density filter 13. The electric field produced by the voltage applied at contacts 24 should be such as not to distort the photocarrier grating, with a typical value of below 200 V/cm.

The two changes in the photocurrent values measured by lockin amplifier 30 corresponding to the interference and non-interference cases of optical apparatus 10 operation are related to one another by a ratio $\beta$ which is defined mathematically further herein. A short qualitative analysis is now presented to explain the nature of the ratio $\beta$ definition and the relationship which it is believed to have to the diffusion length of sample material 20 by virtue of the photocarrier grating effect.

In a sample material 20 having a linear dependence of photoconductivity on the light intensity, the non-interference case of optical apparatus 10 operation has the effect of increasing the photocurrent over that observed in the interference case when an optical grating is created. This is because in the non-interference case, the background and probe beams I1 and I2 add linearly, whereas in the interference case, if the optical grating has a grating period which is very long, then the effect of the interference is to reduce the photocurrent. This effect is due to the fact that in the interference case, more conductive and less conductive regions of sample material 20 are in series; hence, the photocurrent is determined by the less conductive regions which act to reduce it.

As shown by equation (1), the grating period, that is the distance between the minima and maxima of light intensity, can be changed by changing the angle $\delta$ between beams I1 and I2. As long as $\delta$ is such that the grating period remains much longer than the diffusion length, the photocarrier grating effect will cause the maximum reduction of the photocurrent. This is because carrier diffusion across the grating period can be neglected in this case, and this condition will remain in force as long as the changes in $\delta$ remain small. Decreasing the grating period further will eventually lead to the situation where the grating period becomes comparable to the diffusion length and the grating period will be "washed out" or smeared by the increased diffusion of carriers. Thus, the amount of change in the photocurrent between the interference and non-interference case will be reduced.

In the limit, where the grating period becomes equal to or smaller than the diffusion length, this photocarrier grating effect will be washed out completely by the dominant effect of carrier diffusion so that the photocurrent even for the interference case will be increased relative to the photocurrent due to background beam I1, just as for the non-interference case. Thus, when the optical grating period approaching the diffusion length, the ratio $\beta$ of the change in the photocurrents for the two cases approaches unity.

A linear mathematical treatment of the photocarrier grating effect can be developed to calculate the diffusion length L from the measurements described above. There is first defined the ratio $\beta$ as follows:

$$\beta = \sigma \frac{\sigma_1 = \sigma(I1)}{\sigma(I1 + I2) - \sigma(I1)} \quad (2)$$

In the ratio $\beta$ the denominator is the photoconductivity $\sigma(I1+I2)$ due to the non-interference case combination of beams I1 and I2 minus the photoconductivity $\sigma(I1)$ due to the background I1 alone. This is proportional to the measurement taken in the non-interference case operation of optical apparatus 10.

The first term of the numerator is the photoconductivity in the form of a spatial relationship to the optical grating fringes in the interference case, which can be expressed as the average resistivity over the grating period divided by the grating spacing, or as a "grating conductivity" $\sigma_g$. Measured when the photoconductivity due to the background beam I1 alone is the numerator which is proportional to the measurement taken in the interference case operation of optical apparatus 10. As explained above, in the two extreme cases where carrier diffusion is either absent or dominant, $\beta$ will have values of $-1$ or 1 respectively.

In order to obtain a quantitative relationship between B and the diffusion length L, there must first be obtained a solution to an equation known as the continuity equation presented by R. A. Smith in the text Semiconductors, Cambridge University Press (1961). Smith and other workers in the field did not, however, consider the case where the light intensity varies sinusoidally as discussed above in connection with equation (1). In accordance with the principles of the present invention, solution of the the continuity equation under these conditions enables calculation of the photocarrier concentration as a function of the distance between contacts 24 when these carriers are created by light which varies sinusoidally along this dimension. This leads to the observation that the photocarrier concentration also varies sinusoidally with an amplitude A of the variations which is given by:

$$A = 2\alpha \frac{\sqrt{I1 \cdot I2}}{\gamma I1 + I2} \quad (3)$$

where I1 and I2 are the intensities of beams I1 and I2, while $\alpha$ is a factor which represents the power law intensity dependence of photoconductivity, that is, how the photocurrent increases with light intensity. Thus, if the photocurrent is proportional to the light intensity itself, $\alpha$ equals 1, whereas if it is proportional to the two third power of light intensity then $\alpha$ equals $\frac{2}{3}$, etc. Finally, the factor $\gamma$ is related to the diffusion length L as follows:

$$\gamma = \frac{1}{1 + (2\pi L/\Lambda)^2} \quad (4)$$

where $\Lambda$ is the distance between the maxima and minima in the photograting as per equation (1).

In order to obtain the diffusion length L from the measurements carried out in the operation of optical apparatus 10, the factor $\gamma$ must be related in terms of L to the ratio $\beta$ developed from the measurements. The following relationship can be derived:

$$\beta = 1 - \frac{2\alpha\gamma_o}{[1 + (2\pi L/\Lambda)^2]^2} \quad (5)$$

from which the diffusion length L can be extracted as:

$$L = \frac{\Lambda}{2\pi} \left[ \frac{2\alpha\gamma_o^2}{1-\beta} - 1 \right]^{1/2} \quad (6)$$

where $\gamma_o$ is an optical grating quality factor relating to reduced grating visibility, compared to its theoretical value, because of non-ideal measurement conditions.

Figure 2:
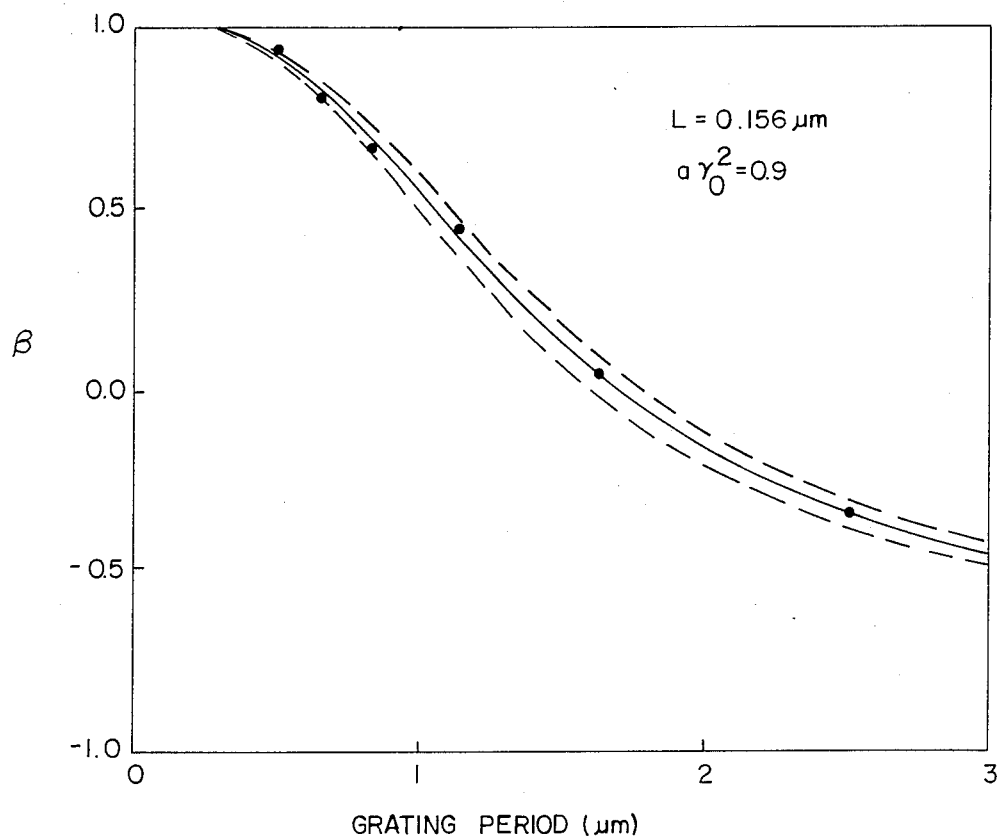
FIG. 2 is a graph of the ratio of the photocurrents measured in the sample material for various arrangments of the optical apparatus of FIG. 1.

Referring now to FIG. 2, there are shown experimentally measured values of $\beta$ plotted versus the grating period for a 2.5 micron thick sample material 20 of a-Si:H, which has a photoconductivity of $2 \times 10^{-5}$ (ohm-cm) at one sun illumination. The solid line is a fit to equation (6) with two free parameters, the diffusion length L and the product $\alpha\gamma^2$. The diffusion length for this sample was calculated to be 0.156 micron, and this value was verified to be in the range found by prior art techniques described earlier.

The optical grating quality factor $\gamma_o$ was determined to be practically unity from the comparison of the value of 0.9 found for $\alpha\gamma_o^2$ in the fitting of the solid line in the plot to the value of $\alpha = 0.86 \pm 0.04$ obtained from a plot of photocurrent versus light intensity. As mentioned previously, this is the power law intensity dependence of photoconductivity, and this characteristic can be obtained by operation of optical apparatus 10 in a mode where the photoconductivity is measured for variable intensity using only background beam I1.

In practical application of the technique of the present invention, it is seen that the diffusion length L can be measured simply by determining the ratio $\beta$ at a given value of $\Lambda$ and applying the relationship presented in equation (6).

In summary, the present invention provides a simple optical apparatus and method for measuring the carrier diffusion length of insulating photoconductors and semiconductors. The method of measurement is straightforward and provides accurate measurements of bulk diffusion lengths as low as 300 angstroms.

While the principles of the invention have been described with regard to particular embodiments, it is to be understood that the description is made by way of example only and not as a limitation on the scope of the invention, which is set forth in the appended claims.

We claim:

1. An optical apparatus for measuring the diffusion length in an insulating photoconductor or a semiconductor sample material, said apparatus comprising;

a source of coherent light;

means for splitting said light source and providing transmitted and reflected beams each having a variable light intensity, one of said transmitted and reflected beams being incident as a background beam at a location on the sample material;

means for directing the other of said transmitted and reflected beams so as to be incident at said location as a probe beam, said directing means establishing a predetermined angle between said background and probe beams at said location;

polarizing means disposed in the path of said background beam and having one of two predetermined orientations corresponding to polarized and nonpolarized states of the beam passing therethrough;

means disposed in the path of said probe beam for periodically blocking the passage thereof; and means for measuring changes in the periodic photocurrent supplied by a power source through the sample material in response to the operation of said periodic blocking means for each of said polarized and non-polarized states to thereby determine the diffusion length of the sample material.

2. The apparatus of claim 1 wherein said source of coherent light a laser.

3. The apparatus of claim 1 wherein said means for splitting said light source is a variable beamsplitter which provides said probe beam with an intensity reduced with respect to that of said background beam.

4. The apparatus of claim 1 wherein said means for splitting said light source is comprises a beamsplitter and a neutral density filter for providing said probe beam with an intensity reduced with respect to that of said background beam.

5. The apparatus of claim 1 wherein said directing means is at least one mirror.

6. The apparatus of claim 1 wherein said polarizing means is a birefringent optical plate of the half wave type.

7. The apparatus of claim 1 wherein said periodic blocking means is a beam chopper.

8. The apparatus of claim 1 wherein said measuring means is a combination of a resistor in series arrangement with said power source and the sample material connected between a pair of contacts, and a lock-in amplifier connected in parallel with said resistor and synchronized with said periodic blocking means, said lock-in amplifier measuring the voltage developed across said resistor when said periodic blocking means allows illumination of the sample material by said probe beam.

9. The apparatus of claim 1 wherein said diffusion length is determined in accordance with the relation:

$$L = \frac{\Lambda}{2\pi} \left[ \frac{2\alpha\gamma_o^2}{1-\beta} - 1 \right]^{1/2}$$

where P1 L=diffusion length;
$\Lambda$ = optical grating period formed when said background beam is in said non-polarized state;
$\alpha$ = factor of power law intensity dependence of photoconductivity;
$\gamma_o^2$ = optical grating quality factor; and
$\beta$ = ratio of said measured periodic photocurrent changes in said non-polarized state to those in said polarized state.

10. A method of measuring the diffusion length of an insulating photoconductor or semiconductor sample material, said method comprising the steps of:
providing a source of coherent light;
splitting said coherent light into a reflected and a transmitted beam each having a variable light intensity, one of said reflected and transmitted beams being incident upon the sample material at a location as a background beam;
periodically directing the other of said reflected and transmitted beams onto the material at said location as a probe beam with a predetermined angle between said background and probe beams;
varying from maximum to minimum the amount of interference between said background and probe beams at said location; and
measuring the periodic changes in the photocurrent flowing through the sample material from a power source connected in series therewith, said measurement being synchronized with the performance of said periodic directing step and being performed during each of said interference and non-interference conditions to thereby determine the diffusion length of the sample material.

11. The method of claim 10 wherein said source of coherent light is a laser.

12. The method of claim 10 wherein said splitting step is performed by a variable beamsplitter which provides said probe beam with an intensity reduced with respect to that of said background beam.

13. The method of claim 10 wherein said splitting step is performed by a combination of a beamsplitter and a neutral density filter for providing said probe beam with an intensity reduced with respect to that of said background beam.

14. The method of claim 10 wherein said interference varying step is performed by rotation of the orientation of a birefringent optical plate of the half wave type.

15. The method of claim 10 wherein said periodic directing step is performed by a mirror in combination with a beam chopper.

16. The method of claim 10 wherein said measuring step is performed by a combination of a resistor in series arrangement with said power source and the sample material connected between a pair of contacts, and a lock-in amplifier connected in parallel with said resistor and synchronized with the performance of said periodic directing step, said lock-in amplifier measuring the voltage developed across said resistor when said periodic directing step allows illumination of the sample material by said probe beam.

17. The method of claim 10 wherein said diffusion length is determined in accordance with the relation:

$$L = \frac{\Lambda}{2\pi} \left[ \frac{2\alpha\gamma_o^2}{1-\beta} - 1 \right]^{1/2}$$

where
L=diffusion length;
$\Lambda$ = optical grating period formed when said background beam is in said non-polarized state;
$\alpha$ = factor of power law intensity dependence of photoconductivity;
$\gamma_o^2$ = optical grating quality factor; and
$\beta$ = ratio of said measured periodic photocurrent changes in said non-polarized state to those in said polarized state.

* * * * *

UNITED STATES PATENT AND TRADEMARK OFFICE
CERTIFICATE OF CORRECTION

PATENT NO. : 4,891,582

DATED : January 2, 1990

INVENTOR(S) : Kurt Weiser et al.

It is certified that error appears in the above-identified patent and that said Letters Patent is hereby corrected as shown below:

column 8, line 43: ";" should be --:--;

column 8, line 68: "light" should be followed by --is--; and column 9, line 35: "Pl L" should be --L--.

Signed and Sealed this

Sixteenth Day of July, 1991

Attest:

HARRY F. MANBECK, JR.

*Attesting Officer*        *Commissioner of Patents and Trademarks*